United States Patent
Briano et al.

(10) Patent No.: US 11,561,112 B2
(45) Date of Patent: Jan. 24, 2023

(54) CURRENT SENSOR HAVING STRAY FIELD IMMUNITY

(71) Applicant: Allegro MicroSystems, LLC, Manchester, NH (US)

(72) Inventors: Robert A. Briano, Auburn, NH (US); Paul A. David, Bow, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 282 days.

(21) Appl. No.: 16/818,199

(22) Filed: Mar. 13, 2020

(65) Prior Publication Data
US 2021/0285794 A1    Sep. 16, 2021

(51) Int. Cl.
*G01D 5/14* (2006.01)
*G01R 33/07* (2006.01)
*G01R 33/09* (2006.01)

(52) U.S. Cl.
CPC ........... *G01D 5/145* (2013.01); *G01R 33/075* (2013.01); *G01R 33/091* (2013.01)

(58) Field of Classification Search
CPC ..... G01D 5/145; G01R 33/075; G01R 33/091
See application file for complete search history.

(56) References Cited

U.S. PATENT DOCUMENTS

| | | |
|---|---|---|
| 5,041,780 A | 8/1991 | Rippel |
| 5,781,005 A | 7/1998 | Vig et al. |
| 5,917,320 A | 6/1999 | Scheller et al. |
| 6,091,239 A | 7/2000 | Vig et al. |
| 6,278,269 B1 | 8/2001 | Vig et al. |
| 6,525,531 B2 | 2/2003 | Forrest et al. |
| 6,693,419 B2 | 2/2004 | Stauth et al. |
| 7,026,808 B2 | 4/2006 | Vig et al. |
| 7,253,614 B2 | 8/2007 | Forrest et al. |
| 7,368,904 B2 | 5/2008 | Scheller et al. |
| 7,476,816 B2 | 1/2009 | Doogue et al. |
| 7,598,601 B2 | 10/2009 | Taylor et al. |
| 7,777,607 B2 | 8/2010 | Taylor et al. |
| 7,816,905 B2 | 10/2010 | Doogue et al. |
| 7,936,164 B2 | 5/2011 | Doogue et al. |
| 8,450,996 B2 | 5/2013 | Foletto et al. |
| 8,624,588 B2 | 1/2014 | Vig et al. |
| 8,729,892 B2 | 5/2014 | Friedrich |

(Continued)

FOREIGN PATENT DOCUMENTS

CN    112649645 A    4/2021

OTHER PUBLICATIONS

U.S. Appl. No. 16/841,853, filed Apr. 7, 2020, Augendre et al.
(Continued)

*Primary Examiner* — Reena Aurora
(74) *Attorney, Agent, or Firm* — Daly Crowley Mofford & Durkee, LLP

(57) ABSTRACT

Methods and apparatus for a current sensor having an elongate current conductor having an input and an output and a longitudinal axis. First, second, third and fourth magnetic field sensing elements are coupled in a bridge configuration and positioned in a plane parallel to a surface of the current conductor such that the second and fourth magnetic field sensing elements comprise inner elements and the first and third magnetic field sensing elements comprise outer elements. Embodiments of the sensor reduce the effects of stray fields on the sensor.

33 Claims, 10 Drawing Sheets

(56) References Cited

U.S. PATENT DOCUMENTS

| | | | |
|---|---|---|---|
| 8,847,590 | B2 | 9/2014 | Flock et al. |
| 8,896,295 | B2 | 11/2014 | Friedrich et al. |
| 8,907,669 | B2 | 12/2014 | Petrie |
| 9,081,041 | B2 | 7/2015 | Friedrich et al. |
| 9,176,170 | B2 * | 11/2015 | Racz .................... G01R 15/202 |
| 9,190,606 | B2 | 11/2015 | Liu et al. |
| 9,739,808 | B2 * | 8/2017 | Fang .................... G01R 15/205 |
| 9,812,637 | B2 | 11/2017 | Fermon et al. |
| 10,481,181 | B2 | 11/2019 | Bussing et al. |
| 2012/0249126 | A1 | 10/2012 | Friedrich et al. |
| 2015/0194597 | A1 * | 7/2015 | Fermon .............. G01R 33/0052 257/421 |
| 2018/0180649 | A1 * | 6/2018 | Paci .................... G01R 15/205 |
| 2018/0238938 | A1 | 8/2018 | Feucht et al. |
| 2019/0234763 | A1 * | 8/2019 | Foletto .................. G01R 33/09 |
| 2019/0391185 | A1 | 12/2019 | El Bacha et al. |
| 2020/0057097 | A1 | 2/2020 | Vuillermet et al. |
| 2020/0057120 | A1 | 2/2020 | Belin et al. |

OTHER PUBLICATIONS

Allegro MicroSystems, LLC, "Coreless, High Precision, Hall-Effect Current Sensor IC with Common-Mode Field Rejection and High Bandwidth (240 kHz);" ACS37612 Data Sheet; Mar. 9, 2020; 22 Pages.

* cited by examiner

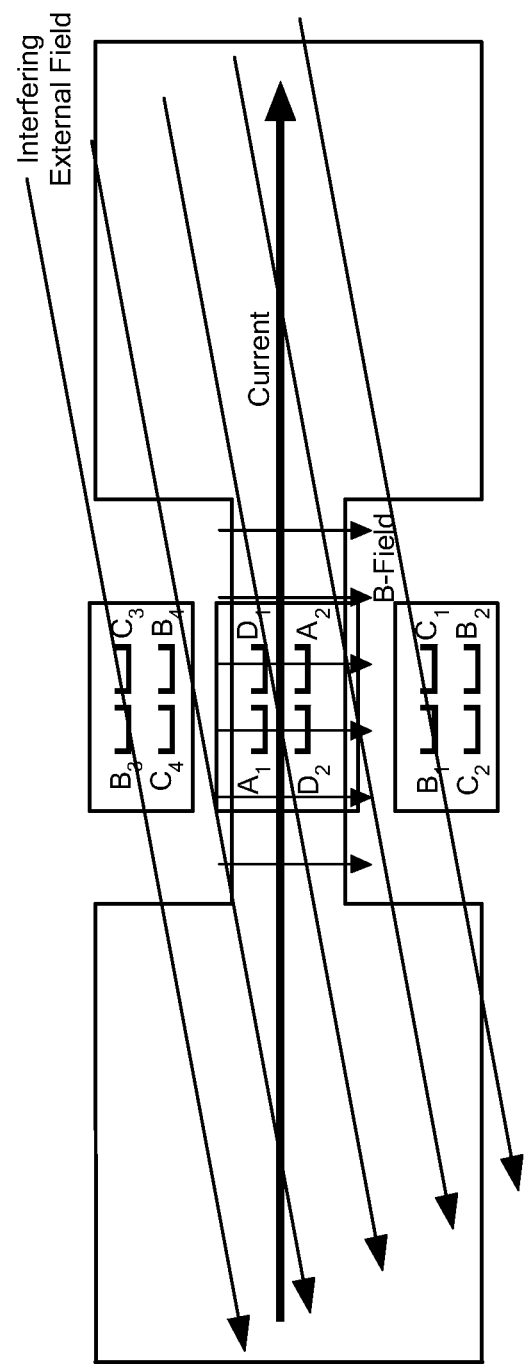
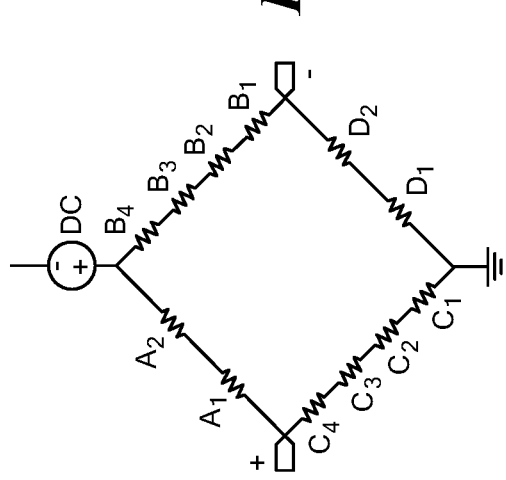

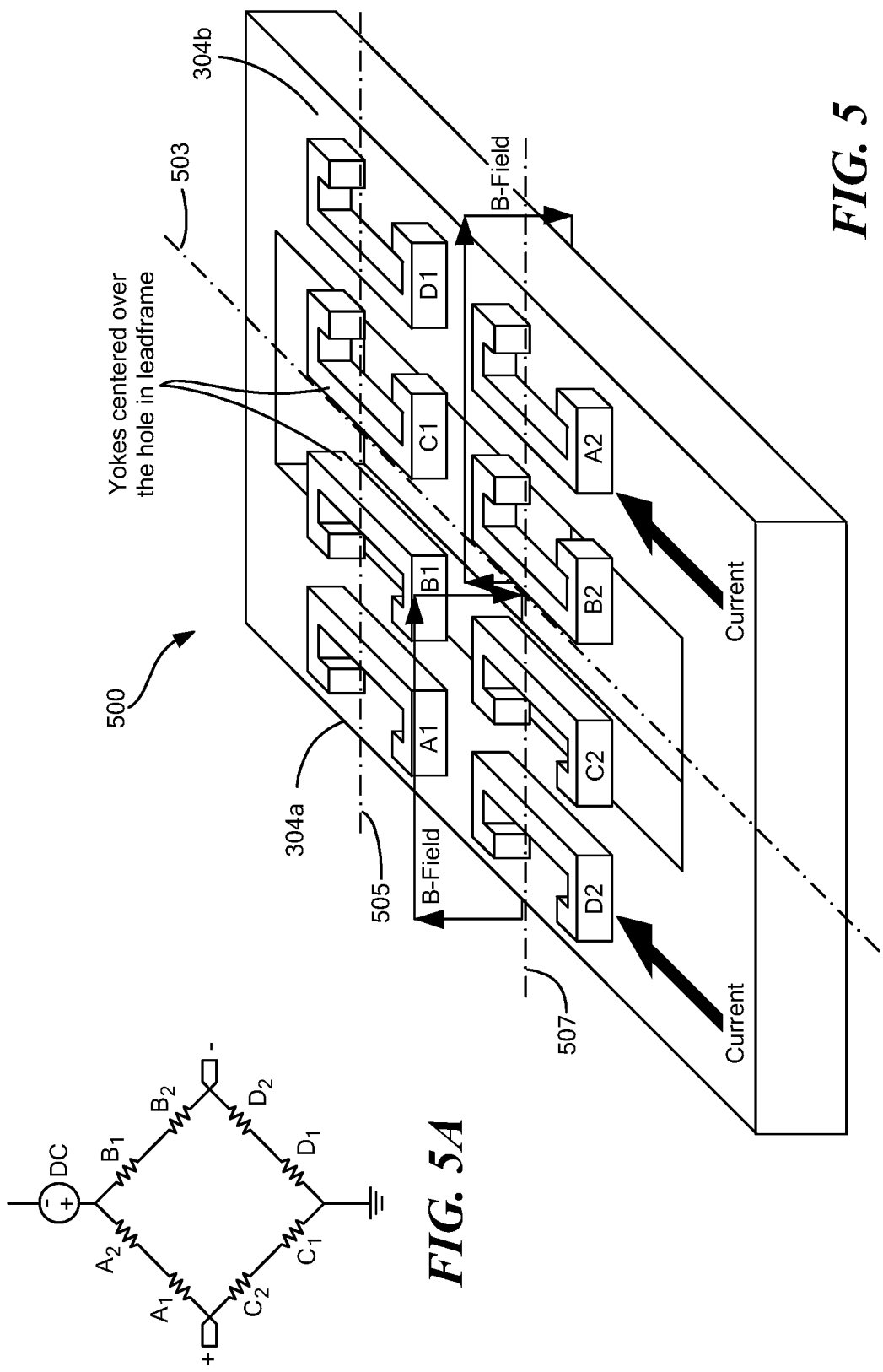

CURRENT SENSOR HAVING STRAY FIELD IMMUNITY

BACKGROUND

As is known in the art, one type of conventional current sensor uses a magnetic field transducer (for example a Hall effect or magnetoresistive transducer) in proximity to a current conductor. The magnetic field transducer generates an output signal having a magnitude proportional to the magnetic field induced by a current that flows through the current conductor.

Various parameters characterize the performance of current sensors, including sensitivity, linearity and offset. Sensitivity is related to the magnitude of a change in output voltage from the Hall effect transducer in response to a sensed current. Linearity is related to the degree to which the output voltage from the Hall effect transducer varies in direct proportion to the sensed current. Offset is related to the output signal when no magnetic field is applied.

The performance of a current sensor can be impacted by stray fields on one or more magnetic field sensing elements of the sensor. For example, a current sensor may include magnetic field sensing elements in a bridge configuration that may be affected by a stray field.

SUMMARY

Example embodiments of the invention provide methods and apparatus for a current sensor having enhanced immunity to stray fields in comparison with conventional current sensors. In example embodiments, magnetic field sensing elements of a bridge are positioned over one or more current conductors so that at least some of the effects of a stray field can be canceled, e.g., subtracted, from the bridge signal.

In one aspect, a current sensor comprises: an elongate current conductor having an input and an output and a longitudinal axis; and first, second, third and fourth magnetic field sensing elements, wherein the first, second, third and fourth magnetic field sensing elements are coupled in a bridge configuration, wherein the first, second, third and fourth magnetic field sensing elements are positioned in a plane parallel to a surface of the current conductor such that the second and fourth magnetic field sensing elements comprise inner elements and the first and third magnetic field sensing elements comprise outer elements with respect to the longitudinal axis, wherein the first and third magnetic field sensing elements are opposite each other in the bridge and the second and fourth magnetic field sensing elements are opposite each other in the bridge, wherein the second and fourth magnetic field sensing elements at least partially overlap with the current conductor, wherein the first, second, third and fourth magnetic field sensing elements are positioned in relation to the current conductor to enhance immunity of the current sensor to an interfering external field.

A current sensor can further include one or more of the following features: the first, second, third and fourth magnetic field sensing elements are aligned along an axis perpendicular to the longitudinal axis of the current conductor, the first, second, third and fourth magnetic field sensing elements are spaced equidistantly along the axis perpendicular to the longitudinal axis of the current conductor, the current conductor includes a narrowed region, wherein the second and fourth magnetic field sensing elements at least partially overlap narrowed portion of the current conductor, the first, second, third and fourth magnetic field sensing elements comprise magnetoresistive elements, the first, second, third and fourth magnetic field sensing elements comprise Hall elements, the first, second, third and fourth magnetic field sensing elements are sensitive in the vertical direction, and/or the sensor is configured to subtract the interfering external field a signal of interest.

In another aspect, a method comprises: employing an elongate current conductor having an input and an output and a longitudinal axis; and employing first, second, third and fourth magnetic field sensing elements, wherein the first, second, third and fourth magnetic field sensing elements are coupled in a bridge configuration, wherein the first, second, third and fourth magnetic field sensing elements are positioned in a plane parallel to a surface of the current conductor such that the second and fourth magnetic field sensing elements comprise inner elements and the first and third magnetic field sensing elements comprise outer elements with respect to the longitudinal axis, wherein the first and third magnetic field sensing elements are opposite each other in the bridge and the second and fourth magnetic field sensing elements are opposite each other in the bridge, wherein the second and fourth magnetic field sensing elements at least partially overlap with the current conductor, wherein the first, second, third and fourth magnetic field sensing elements are positioned in relation to the current conductor to enhance immunity of the current sensor to an interfering external field.

A method can further include one or more of the following features: the first, second, third and fourth magnetic field sensing elements are aligned along an axis perpendicular to the longitudinal axis of the current conductor, the first, second, third and fourth magnetic field sensing elements are spaced equidistantly along the axis perpendicular to the longitudinal axis of the current conductor, the current conductor includes a narrowed region, wherein the second and fourth magnetic field sensing elements at least partially overlap narrowed portion of the current conductor, wherein the first, second, third and fourth magnetic field sensing elements comprise magnetoresistive elements, the first, second, third and fourth magnetic field sensing elements comprise Hall elements, the first, second, third and fourth magnetic field sensing elements are sensitive in the vertical direction, the sensor is configured to subtract the interfering external field from a signal of interest.

In a further aspect, a current sensor comprises: an elongate current conductor having an input and an output and a longitudinal axis, wherein the elongate conductor includes first and second conductors coupled in parallel and separated by a non-conductive region between the first and second conductors; and first, second, third and fourth magnetic field sensing elements, wherein the first, second, third and fourth magnetic field sensing elements are coupled in a bridge configuration, wherein the first, second, third and fourth magnetic field sensing elements are positioned in a plane parallel to a surface of the current conductor such that the second and fourth magnetic field sensing elements comprise inner elements and the first and third magnetic field sensing elements comprise outer elements with respect to the longitudinal axis, wherein the first and third magnetic field sensing elements are opposite each other in the bridge and the second and fourth magnetic field sensing elements are opposite each other in the bridge, wherein the second magnetic field sensing element at least partially overlaps with the first conductor and the fourth magnetic field sensing element at least partially overlaps with the second conductor, wherein the first, second, third and fourth magnetic field sensing elements are positioned in relation to the current conductor to enhance immunity of the current sensor to an interfering external field.

A current sensor can include one or more of the following features: the first, second, third and fourth magnetic field sensing elements are aligned along an axis perpendicular to the longitudinal axis of the current conductor, the first, second, third and fourth magnetic field sensing elements are spaced equidistantly along the axis perpendicular to the longitudinal axis of the current conductor, the first and third magnetic field sensing elements at least partially overlap with the non-conductive region, the first, second, third and fourth magnetic field sensing elements comprise magnetoresistive elements, the first, second, third and fourth magnetic field sensing elements comprise Hall elements, the first, second, third and fourth magnetic field sensing elements are sensitive in the vertical direction, and/or the sensor is configured to subtract the interfering external field from a signal of interest.

In a further aspect, a method comprises: employing an elongate current conductor having an input and an output and a longitudinal axis, wherein the elongate conductor includes first and second conductors coupled in parallel and separated by a non-conductive region between the first and second conductors; and employing first, second, third and fourth magnetic field sensing elements, wherein the first, second, third and fourth magnetic field sensing elements are coupled in a bridge configuration, wherein the first, second, third and fourth magnetic field sensing elements are positioned in a plane parallel to a surface of the current conductor such that the second and fourth magnetic field sensing elements comprise inner elements and the first and third magnetic field sensing elements comprise outer elements with respect to the longitudinal axis, wherein the first and third magnetic field sensing elements are opposite each other in the bridge and the second and fourth magnetic field sensing elements are opposite each other in the bridge, wherein the second magnetic field sensing element at least partially overlaps with the first conductor and the fourth magnetic field sensing element at least partially overlaps with the second conductor, wherein the first, second, third and fourth magnetic field sensing elements are positioned in relation to the current conductor to enhance immunity of the current sensor to an interfering external field.

A method can further include one or more of the following features: the first, second, third and fourth magnetic field sensing elements are aligned along an axis perpendicular to the longitudinal axis of the current conductor, the first, second, third and fourth magnetic field sensing elements are spaced equidistantly along the axis perpendicular to the longitudinal axis of the current conductor, the first and third magnetic field sensing elements at least partially overlap with the non-conductive region, the first, second, third and fourth magnetic field sensing elements comprise magnetoresistive elements, the first, second, third and fourth magnetic field sensing elements comprise Hall elements, the first, second, third and fourth magnetic field sensing elements are sensitive in the vertical direction, and/or the sensor is configured to subtract the interfering external field from a signal of interest.

In a further aspect, a current sensor comprises: a means for conducting current; and first, second, third and fourth means for sensing magnetic fields generated by the means for conducting current; and a means for subtracting an interfering external field affecting the first, second, third and fourth means for sensing magnetic fields.

BRIEF DESCRIPTION OF THE DRAWINGS

The foregoing features of the invention, as well as the invention itself may be more fully understood from the following detailed description of the drawings, in which:

FIG. 2A is a circuit diagram showing the magnetic field sensing elements of FIG. 2 coupled in a bridge configuration positioned over a current conductor with an interfering external field;

FIG. 4A shows the portion of a magnetic field sensor of FIG. 4 with an interfering external field;

FIG. 4B is a circuit diagram showing the magnetic field sensing elements of FIG. 4 coupled in a bridge configuration with an interfering external field;

FIG. 5 is a schematic representation of another example embodiment of a portion of a magnetic field sensor having magnetic field sensing elements positioned over a current conductor;

FIG. 5A is a circuit diagram showing the magnetic field sensing elements of FIG. 5 coupled in a bridge configuration;

DETAILED DESCRIPTION

Figure 1:
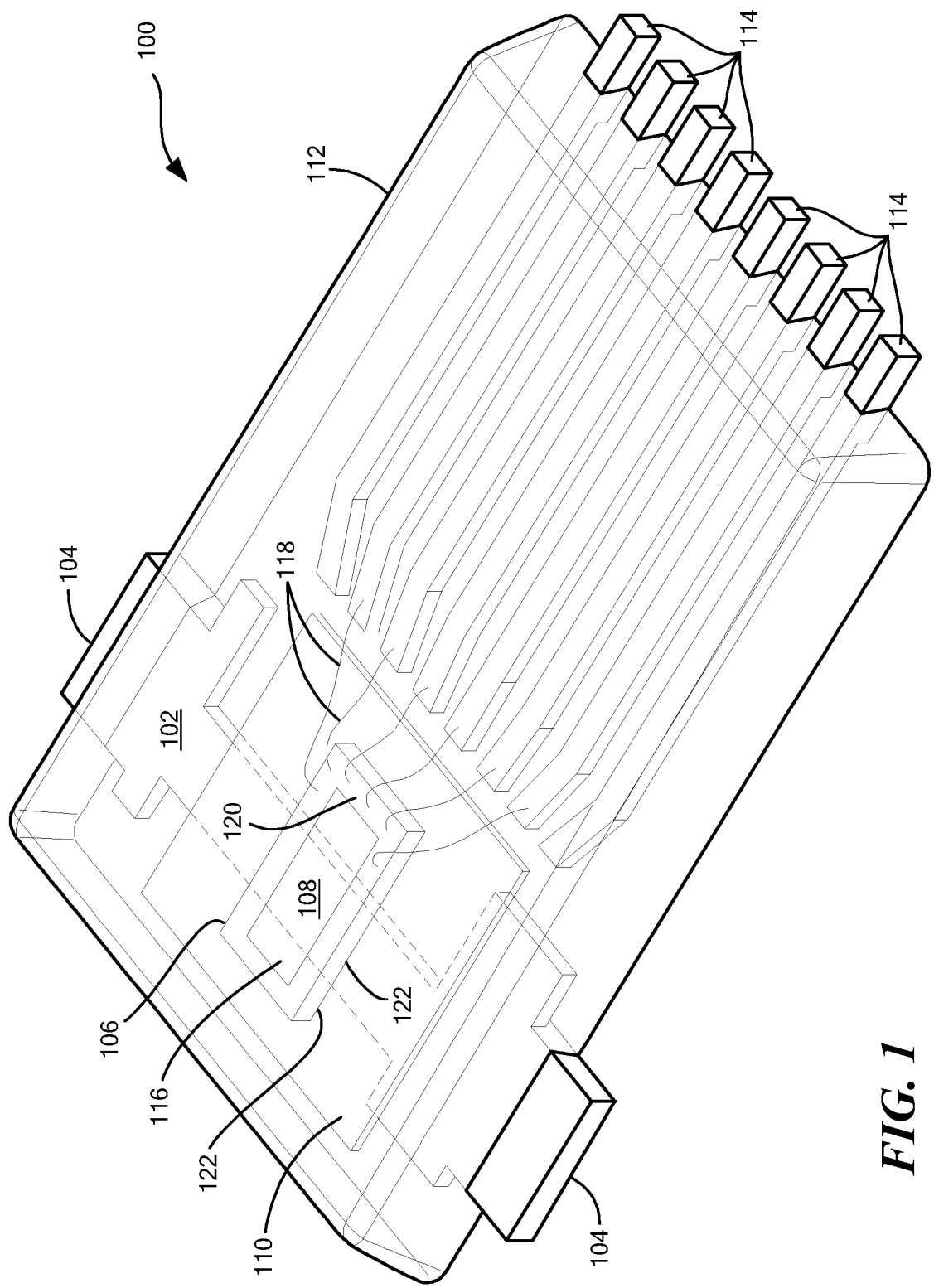
FIG. 1 is a schematic representation of a coreless current sensor in an IC package having resistance to the effects of a stray field.

FIG. 1 shows an example current sensor integrated circuit 100 including a lead frame 102 having a current conductor 104. A semiconductor die 106 is disposed adjacent to the current conductor 104 and includes a magnetic field sensing circuit 108 to sense a magnetic field associated with a current through the current conductor 104. An insulation structure 110 is disposed between the current conductor 104 and the semiconductor die 106. A non-conductive insulative material 112 encloses the semiconductor die 106, the insulation structure 110, a portion of the current conductor 104, and portions of secondary leads 114 to form an integrated circuit package. In embodiments, a portion 116 of the current conductor 104 overlapping the magnetic field sensing circuit 108 is narrower than non-overlapping portions. The magnetic field sensing circuit 108 can include circuitry and one or more bridges having magnetic field sensing elements positioned to cancel at least a portion of an undesired stray field, as described more fully below.

In operation, when a current flows through the current conductor 104, the magnetic field sensing elements of the magnetic field circuit 108 convert the sensed magnetic field into a proportional voltage. An output based on that voltage is made available at one or more of the secondary leads 114.

The magnetic field sensing circuit 108 may be electrically coupled to one or more of secondary leads 114 by an interconnect 118, such as a wirebond. In the illustrated embodiment, the interconnect takes the form of wire bonds 118 and the die is positioned over the current conductor 104 in a "die up" configuration in which the magnetic field sensing elements are supported on a die surface 120 distal from the current conductor 104. In order to accommodate soldering of the wire bonds 118, bond pads may be provided on the die surface 120 and on the secondary signal leads. In alternative embodiments, the current sensor may take the form of a "flip chip" configuration in which the magnetic field sensing elements are supported on a die surface 122 proximal to the current conductor 104. In a flip chip configuration, the interconnect 118 may take the form of solder balls or solder bumps. It is understood that any practical IC technology can be used.

Figure 2:
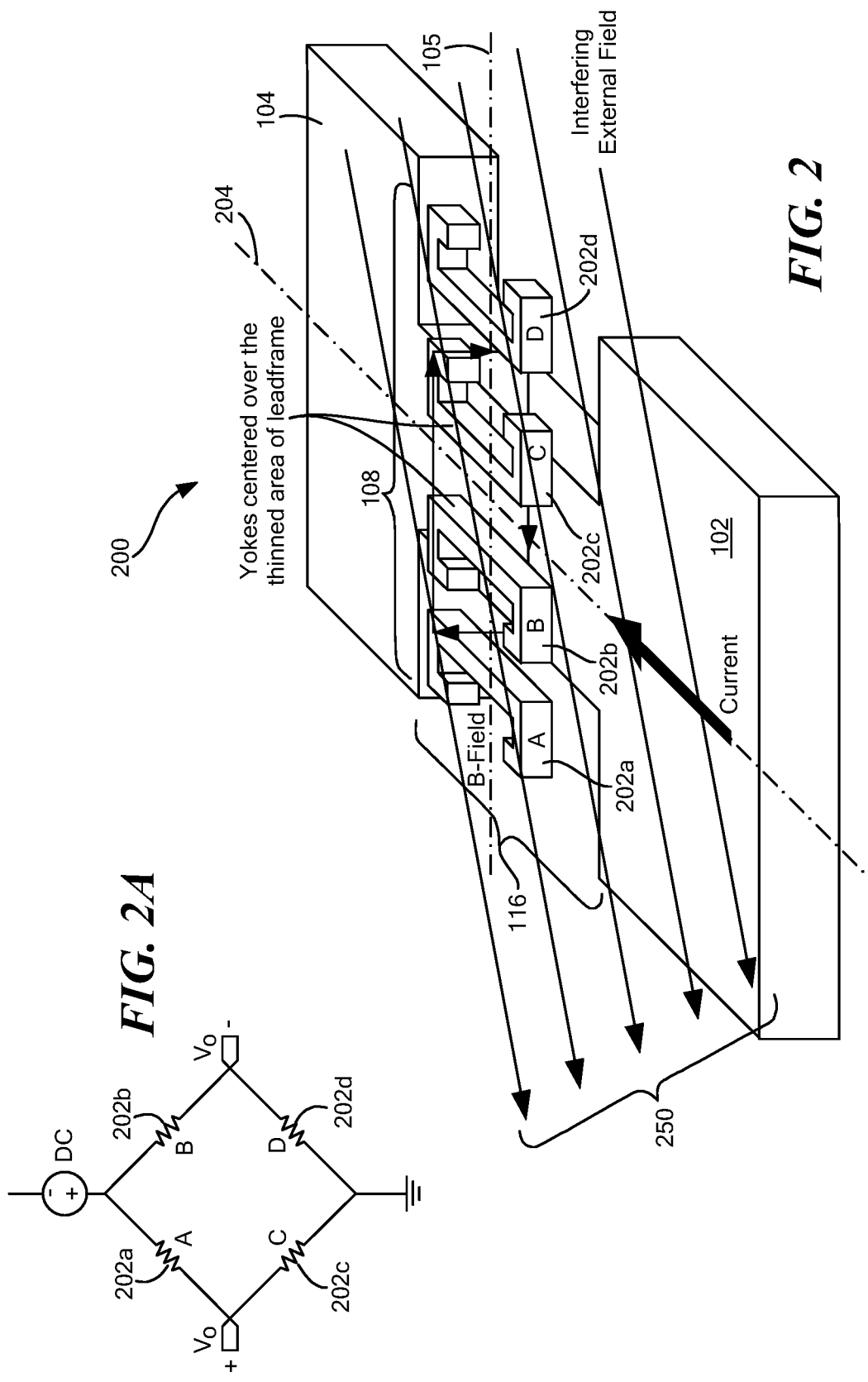
FIG. 2 is a schematic representation of an example embodiment of a portion of a magnetic field sensor having magnetic field sensing elements positioned over a current conductor.

FIG. 2 shows a portion of a sensor IC having first, second, third, and fourth magnetic field sensing elements 202a, b, c, d (also designated as A, B, C, D) coupled in a bridge configuration, such as the electrical circuit shown in FIG. 2A, in a plane parallel to the leadframe 102, and in particular, a narrowed portion 116 of the current conductor 104. In the illustrated embodiment, the second and third magnetic field sensing elements 202b,c are aligned above the narrowed portion 116 of the current conductor 116 and are sensitive in opposite direction, differential sensing. The first and fourth magnetic field sensing elements 202a, d, (also differential) are less affected by the magnetic field generated by current through the current conductor 204 than the second and third magnetic field sensing elements 202b,c, which are the inner elements closest to the center conductor. In the illustrated embodiment, the magnetic field sensing element 202a-d yokes are centered about a longitudinal axis 204 of the current conductor 104 and are equidistant from each other and aligned along axis 105. As can be seen in FIG. 2A, the second and third magnetic field sensing elements 202b,c, which are the inner elements closest to the current conductor 104, are diametrically opposed to each other in the bridge. Similarly, the first and fourth elements 202a,d, which are the outer elements, are also diametrically opposed to each in the bridge. U.S. Pat. No. 9,812,637, which is incorporated herein, shows example yoke configurations and materials.

In the illustrated embodiment, an undesirable interfering stray field 250 is present to which each of the magnetic field sensing elements 202a, b, c, d respond similarly. With this arrangement, the interfering stray field 250 can be subtracted from the signal of interest, which is strongest in the inner elements closest to the center conductor 104, e.g., the second and third magnetic field sensing elements 202b,c. If the stray field is uniform, common mode, a simple differential sensor will sense the field equally and reject the stray field. Any stray field gradient is assumed uniform across the sensing network in the field will be canceled by A/D and B/C.

In general for any field:

$$Vout+-Vout-=((\Delta Rc/(\Delta Ra+\Delta Rc))-(\Delta Rd/(\Delta Rb+\Delta Rd)))$$
$$* \propto B\text{field}$$

For resistor change due to current: $\Delta Ra=-\Delta Rd$  $\Delta Rb=-\Delta Rc$ For uniform external field (Bext): $\Delta Ra=\Delta Rb=\Delta Rc=\Delta Rd$ Therefore $Vout+-Vout-=0$ For external field with uniform gradient ($\Delta$Bext) and uniform sensor spacing:

$$\Delta Ra+\Delta Rc \propto 2\Delta B\text{ext}$$

$$\Delta Rb+\Delta Rd \propto 2\Delta B\text{ext}$$

$$\Delta Rc+\Delta Rd \propto B\text{ext}$$

Therefore: $Vout+-Vout-=0$

It is understood that the magnetic field sensing element can comprise any suitable type to meet the needs of a particular application. In some embodiments, magnetoresistive elements, such as Giant Magnetoresistive (GMR) elements are used. In other embodiments, other types of magnetoresistive elements, such as TMR and/or AMR, are used. In some embodiments, Hall elements are used. One of ordinary skill in the art will understand how to position one or more magnetoresistance elements relative to a current conductor portion in accordance with embodiments of the present invention to achieve the desired results.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 3:
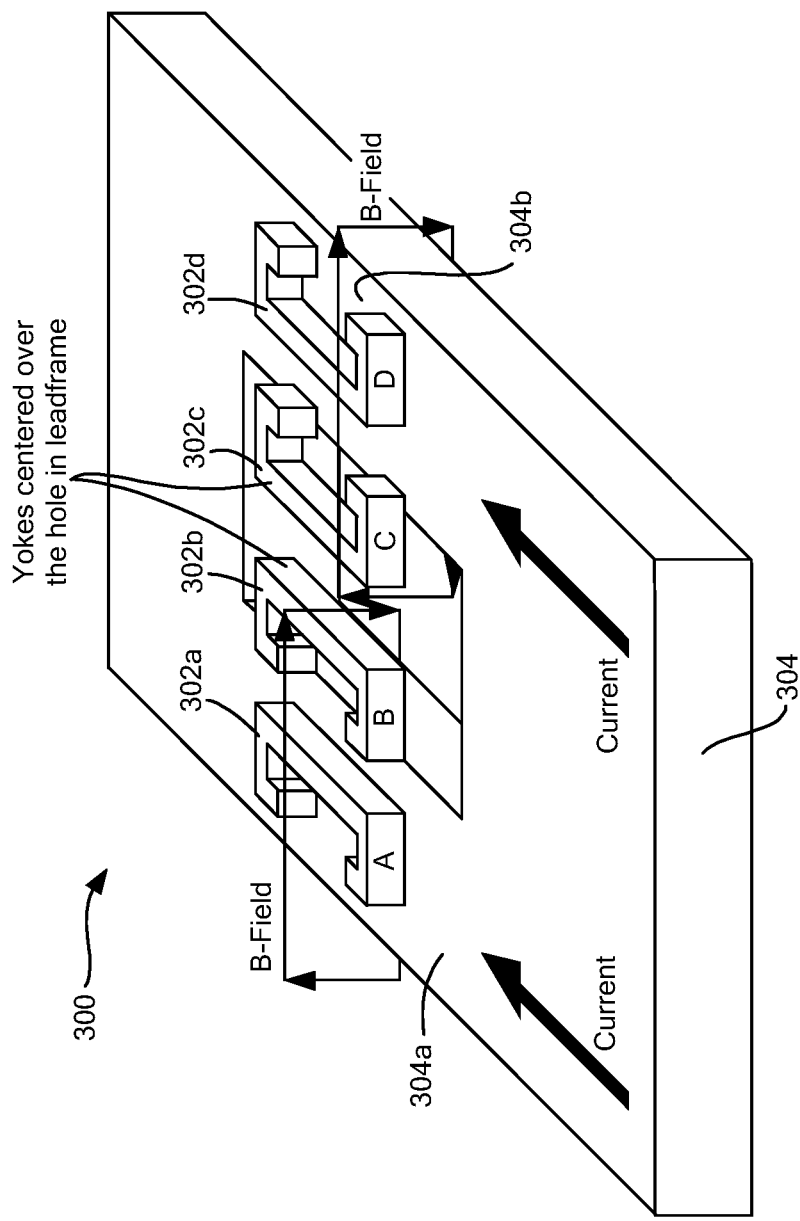
FIG. 3 is a schematic representation of another example embodiment of a portion of a magnetic field sensor having magnetic field sensing elements positioned over a current conductor.

FIG. 3 shows another embodiment of a portion of a current sensor 300 having some similarity with the sensor of FIGS. 1 and 2. Instead of the narrowed portion of the current conductor in the sensor of FIG. 2, the current sensor 300 of FIG. 3 includes a current conductor 304 having a hole in the middle defined by first and second portions 304a,b. In the illustrated embodiment, the first portion 304a comprises a left portion and the second portion 304b comprises a right portion. The magnetic field sensing elements 302a, b, c, d (A,B,C,D) form an electrical bridge, such as that shown in FIG. 2A. The first and fourth magnetic field sensing elements 302a,d, e.g., the outer elements, are most affected by a magnetic field generated by current flow through the conductor 304 since they are closest to current conductor portions 304a,b. The first magnetic field sensing element 302a is positioned over the left portion 304a of the current conductor and the fourth magnetic field sensing element 302d is positioned over the right portion 304b of the current conductor. The second and third magnetic field sensing elements 302b,c are less affected by the current flow in the current conductor. The magnetic field sensing elements 302a-d may be similarly affected by a stray field.

It is understood that relative terms, such as "right," "left," "inner," "outer," and the like, may be used to facilitate an understanding of an example embodiments. Such terms are not to be construed as limiting the scope of the claimed invention in any way, but rather to describe an example embodiment.

Figure 4:
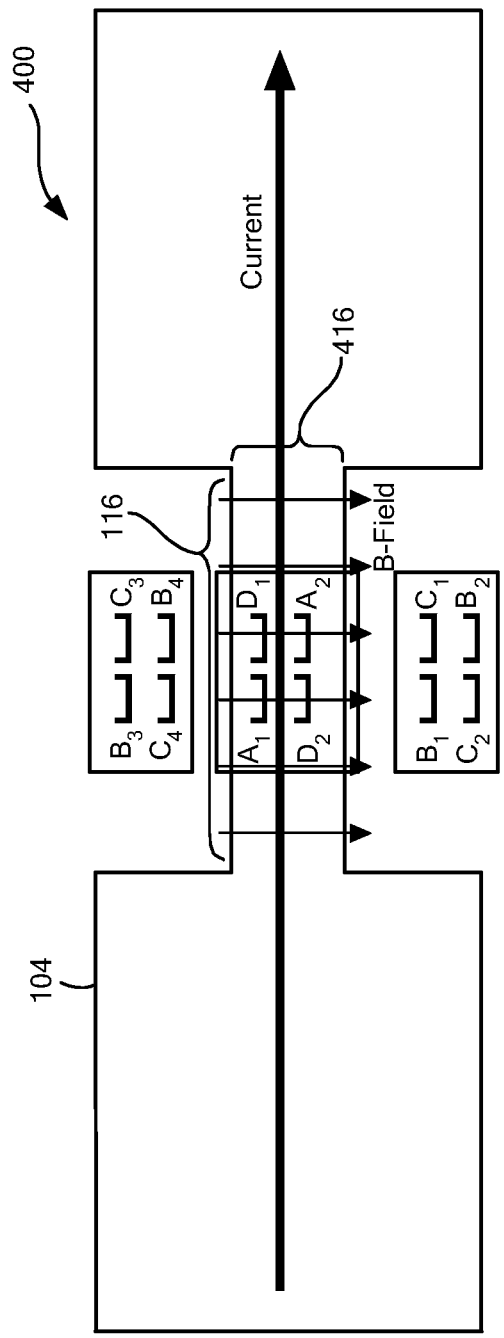
FIG. 4 is a schematic representation of another example embodiment of a portion of a magnetic field sensor having magnetic field sensing elements positioned over a current conductor.

FIG. 4 shows a further embodiment 400 of a portion of a current sensor 400 having enhanced stray field cancellation where an example interfering external field is shown in FIG. 4A. The current conductor 104 is similar to that of the sensor portion 200 of FIG. 2 having a narrowed portion 416. A bridge having twelve magnetic field sensing elements is positioned in a plane parallel to the narrowed portion 416 of the current conductor. An example bridge circuit is shown in FIG. 4B. The A element of FIGS. 2 and 2A is replaced with A1 and A2 in FIG. 4A, the B element is replaced with B1, B2, B3, B4, the C element is replaced with C1, C2, C3, C4 and the D element is replaced with D1, D2. As can be seen, a set of four magnetic field sensing elements A1, A2, D1, D2 are aligned in a plane to overlap a narrowed portion 416 of the current conductor 104. Due to their proximity to the current conductor 104, these elements are more responsive to the magnetic field generated by current flow in the conductor 104 than the remaining elements.

Figure 4C:
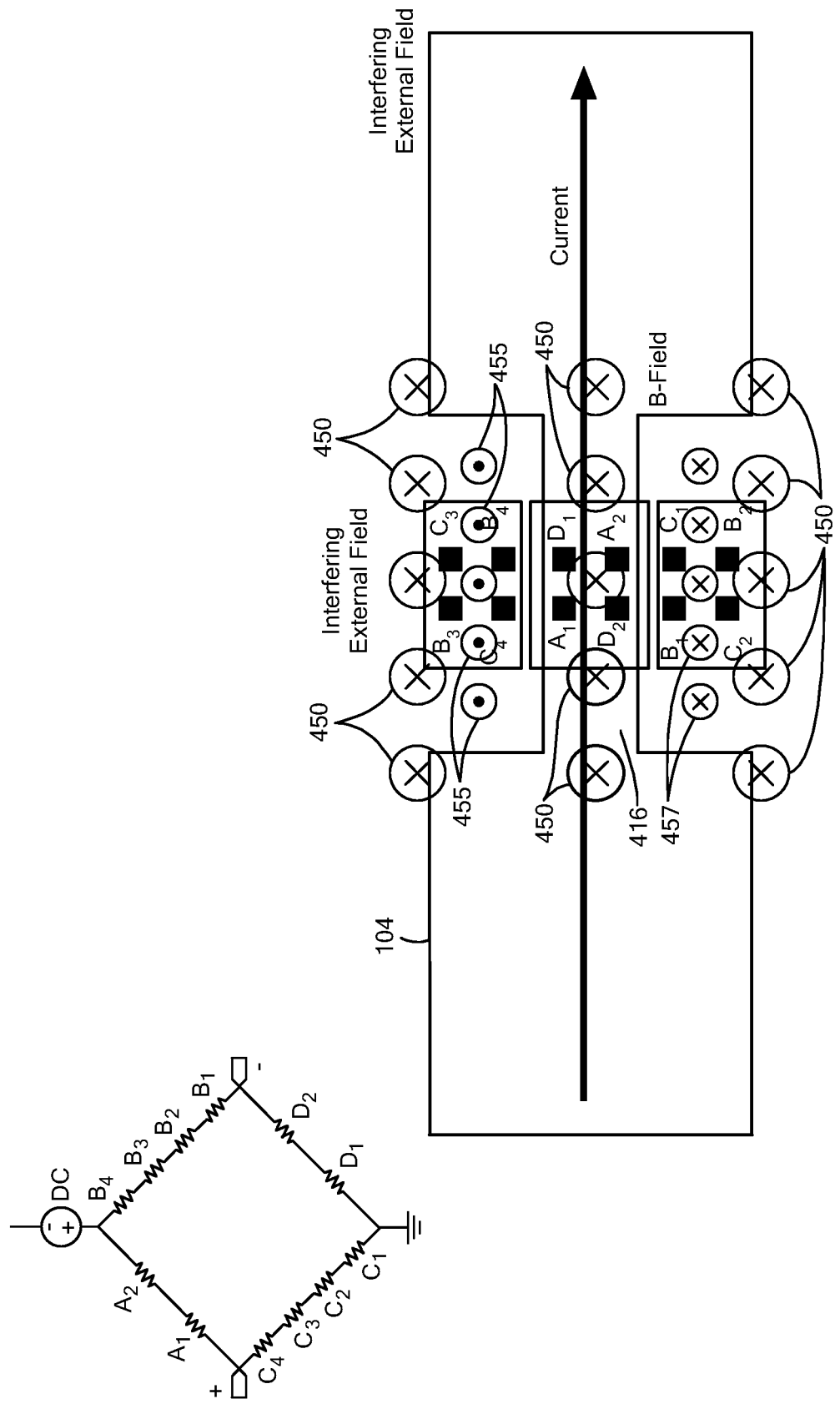
FIG. 4C shows further detail for example fields that may be present for the portion of the magnetic field sensor of FIG. 4.

FIG. 4C shows a further embodiment of a portion of a current sensor having enhanced stray field cancellation with magnetic field sensing elements that have vertical sensitivity, such as vertical Hall elements. The magnetic field sensing elements A1, A2, B1, B2, B3, B4, C1, C2, C3, C4, D1, D2 are shown positioned in relation to the current conductor 104 and electrically connected as shown in the bridge circuit. The interfering stray field is indicated with an X in a circle 450 to indicate that the field goes into the page.

As can be seen the stray field indicators 450 show a relatively consistent field on each of the magnetic field sensing elements A1, A2, B1, B2, B3, B4, C1, C2, C3, C4, D1, D2.

The B-field generated by current flow in the current conductor 104 surrounds the current conductor so that first field indicators 455, which are 'above' the current conductor in the figure, come out of the page (dot in circle), and second field indicators 457, which are 'below' the narrowed portion 416 of the current conductor 104, go into the page (x in circle). It is understood that magnetic field sensing elements B1, B2, C1, C2, which are sensitive in the vertical direction, see the strongest field from current flow in the current conductor 104.

FIG. 5 shows an example sensor 500 having some commonality with the sensor of FIG. 3 including a current conductor 304 having a hole in the middle defined by a first and second portions 304a,b, which provide current paths. A series of magnetic field sensing elements A1, A2, B1, B2, C1, C2, D1, D2 are connected in an electrical bridge circuit as shown and positioned in relation to the first and second current conductor portions 304a,b. In the illustrated embodiment, magnetic field sensing elements B1, C1, B2, C2 generally overlap with the open area of the current conductor while magnetic field sensing elements A1, D1, A2, D2 overlap with one of the first and second portions 304a,b of the current conductor. More particularly, magnetic field sensing elements A1, D2 overlap with the first conductor portion 304a and magnetic field sensing elements A2, D1 overlap with the second conductor portion 304b. Thus, magnetic field sensing elements A1, D2 and A2, D1 will see a higher field strength from the field generated by the current conductor 304 than magnetic field sensing elements B1, C1, B2, C2. In the illustrated embodiment, each leg of the bridge has two magnetic field sensing elements wherein elements A1, B1, C1, D1 are positioned next to each other along a first axis 505 perpendicular to the longitudinal axis 503 of the current conductor and elements A2, B2, C2, D2 are positioned next to each other along a second axis 507 perpendicular to the longitudinal axis 503. In embodiments, the magnetic field sensing elements are positioned in relation to each other and to the current conductor to achieve symmetry so that opposite elements in the bridge see symmetric field strengths.

Figure 6:
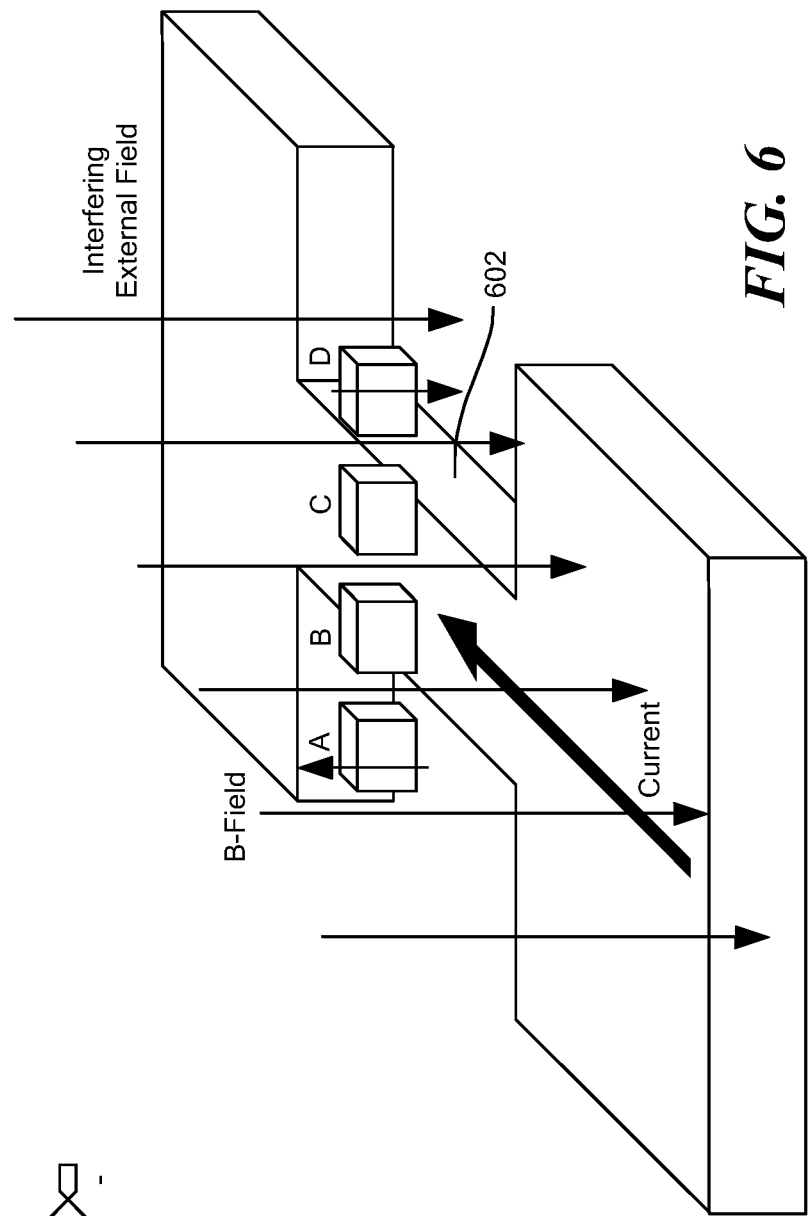
FIG. 6 is a schematic representation of another example embodiment of a portion of a magnetic field sensor having magnetic field sensing elements positioned over a current conductor.
Figure 6A:
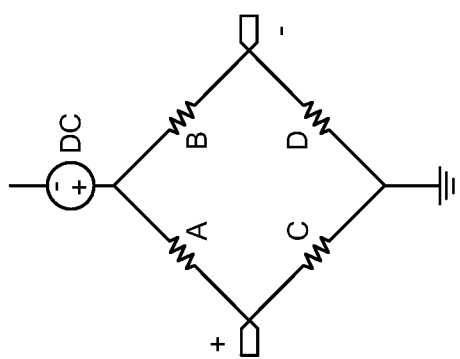
FIG. 6A shows an electrical circuit for an example bridge configuration for the sensor or FIG. 6.

FIG. 6 shows an example sensor 600 having magnetic field sensing elements provided as Hall elements A, B, C, D. An external interfering stray field has vertical flux lines, as shown, which affect the Hall elements. The B-field generated by current through the current conductor 602 is also shown. As can be seen, magnetic field sensing elements B, C, which overlap with the current conductor 602 and can be considered inner elements, see a stronger field from current flow in the current conductor than magnetic field sensing elements A, D which are farther from the current conductor as they are the outer elements. FIG. 6A shows an electrical circuit for a bridge configuration.

Figure 7:
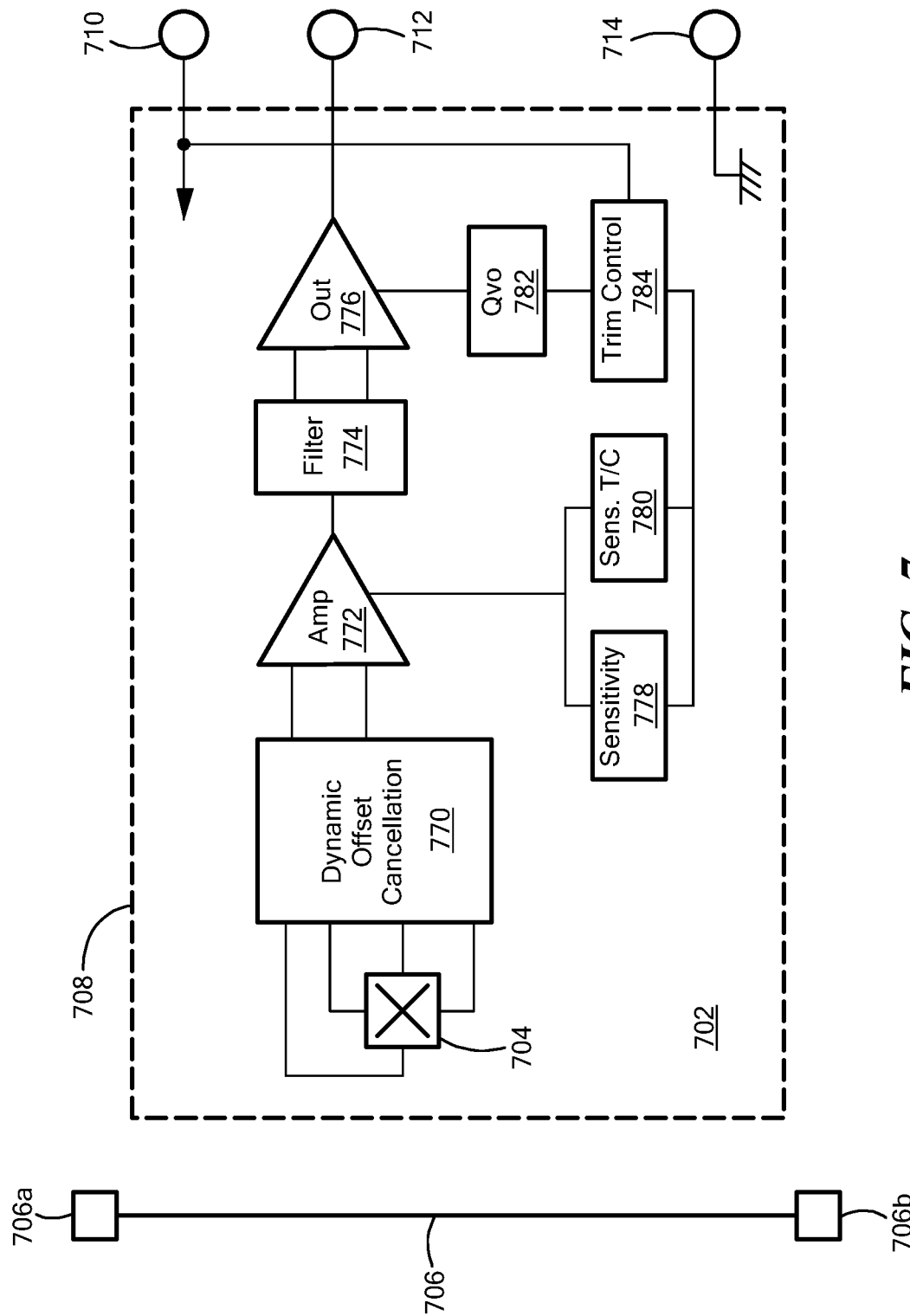
FIG. 7 is a functional block diagram of an example current sensor having stray field resistance.

Referring to FIG. 7, a block diagram of an example current sensor 700 having stray field immunity in accordance with example embodiments of the invention is shown. A magnetic field sensing circuit 702 includes one or more magnetic field sensing elements 704 connected in a bridge for sensing a current flow in a current conductor 706 between terminals 706a and 706b. The magnetic field sensing circuit 702 may be supported by semiconductor die 708. Lead 710 may provide a power connection to the circuit, lead 712 may provide a connection to a current sensor output signal indicative of a sensed primary current, and lead 714 may provide a reference, or ground connection to the circuit.

The magnetic field sensing elements 704 may be coupled to a dynamic offset cancellation circuit 770, which provides a DC offset adjustment for DC voltage errors associated with the magnetic field sensing elements 704.

The dynamic offset cancellation circuit 770 may be coupled to an amplifier 772 that amplifies the offset-adjusted signal. The amplifier 772 may be coupled to a filter 774 that can be a low pass filter, a high pass filter, a band pass filter, and/or a notch filter. The filter is selected in accordance with a variety of factors including, but not limited to, desired response time, the frequency spectrum of the noise associated with the magnetic field sensing element 704, the dynamic offset cancellation circuit 770, and the amplifier 772. In one particular embodiment, the filter 774 is a low pass filter. The filter 774 may be coupled to an output driver 776 that provides an enhanced power output for transmission to other electronics (not shown).

A trim control circuit 784 may be coupled to lead 710 through which power is provided during operation. Lead 710 may also permit various current sensor parameters to be trimmed, typically during manufacture. To this end, the trim control circuit 784 includes one or more counters enabled by an appropriate signal applied to the lead.

The trim control circuit 784 may be coupled to a quiescent output voltage (Qvo) circuit 782. The quiescent output voltage is the voltage at output lead 712 when the current through conductor 706 is zero. Nominally, for a unipolar supply voltage, Qvo is equal to Vcc/2. Qvo can be trimmed by applying a suitable trim signal through the lead to a first trim control circuit counter within the trim control circuit 784 which, in turn, controls a digital-to-analog converter (DAC) within the Qvo circuit 782.

The trim control circuit 784 may be further coupled to a sensitivity adjustment circuit 778. The sensitivity adjustment circuit 778 may permit adjustment of the gain of the amplifier 772 in order to adjust the sensitivity of the current sensor. The sensitivity can be trimmed by applying a suitable trim signal through the lead to a second trim control circuit counter within the trim control circuit 784 which, in turn, controls a DAC within the sensitivity adjustment circuit 778.

The trim control circuit 784 may be further coupled to a sensitivity temperature compensation circuit 780. The sensitivity temperature compensation circuit 780 permits adjustment of the gain of the amplifier 772 in order to compensate for gain variations due to temperature. The sensitivity temperature compensation can be trimmed by applying a suitable trim signal through the lead to a third trim control circuit counter within the trim control circuit 784 which, in turn, controls a DAC within the sensitivity temperature compensation circuit 780.

As used herein, the term "accuracy," when referring to a magnetic field sensor, is used to refer to a variety of aspects of the magnetic field sensor. Illustrative sensors include current sensors, angle sensors, speed sensors and the like. These aspects include, but are not limited to, an ability of the magnetic field sensor to differentiate: a gear tooth from a gear valley (or, more generally, the presence of a ferromagnetic object from the absence of a ferromagnetic object) when the gear is not rotating and/or when the gear is rotating (or, more generally, when a ferromagnetic object is moving or not moving), an ability to differentiate an edge of a tooth of the gear from the tooth or the valley of the gear (or, more generally, the edge of a ferromagnetic object or a change in magnetization direction of a hard ferromagnetic object), and a rotational accuracy with which the edge of the gear tooth is identified (or, more generally, the positional accuracy with which an edge of a ferromagnetic object or hard ferromagnetic object can be identified). Ultimately, accuracy refers to output signal edge placement accuracy and consistency with respect to gear tooth edges passing by the magnetic field sensor.

The terms "parallel" and "perpendicular" are used in various contexts herein. It should be understood that the terms parallel and perpendicular do not require exact perpendicularity or exact parallelism. One of ordinary skill in the art can readily determine the exactness required for such terms. In addition, normal manufacturing tolerances apply, which tolerances depend upon the context.

It is desirable for magnetic field sensors to achieve a certain level or amount of accuracy even in the presence of variations in an air gap between the magnetic field sensor and the gear that may change from installation to installation or from time to time. It is also desirable for magnetic field sensors to achieve accuracy even in the presence of variations in relative positions of the magnet and the magnetic field sensing element within the magnetic field sensor. It is also desirable for magnetic field sensors to achieve accuracy even in the presence of unit-to-unit variations in the magnetic field generated by a magnet within the magnetic field sensors. It is also desirable for magnetic field sensors to achieve accuracy even in the presence of variations of an axial rotation of the magnetic field sensors relative to the gear. It is also desirable for magnetic field sensors to achieve accuracy even in the presence of temperature variations of the magnetic field sensors.

Example magnetic field sensors can have a variety of features that may be described in one or more of the following patents or patent publications: U.S. Pat. Nos. 6,525,531, 6,278,269, 5,781,005, 7,777,607, 8,450,996, 7,772,838, 7,253,614, 7,026,808, 8,624,588, 7,368,904, 6,693,419, 8,729,892, 5,917,320, 6,091,239, 2012/0249126, all of which are herein incorporated herein by reference.

Figure 8:
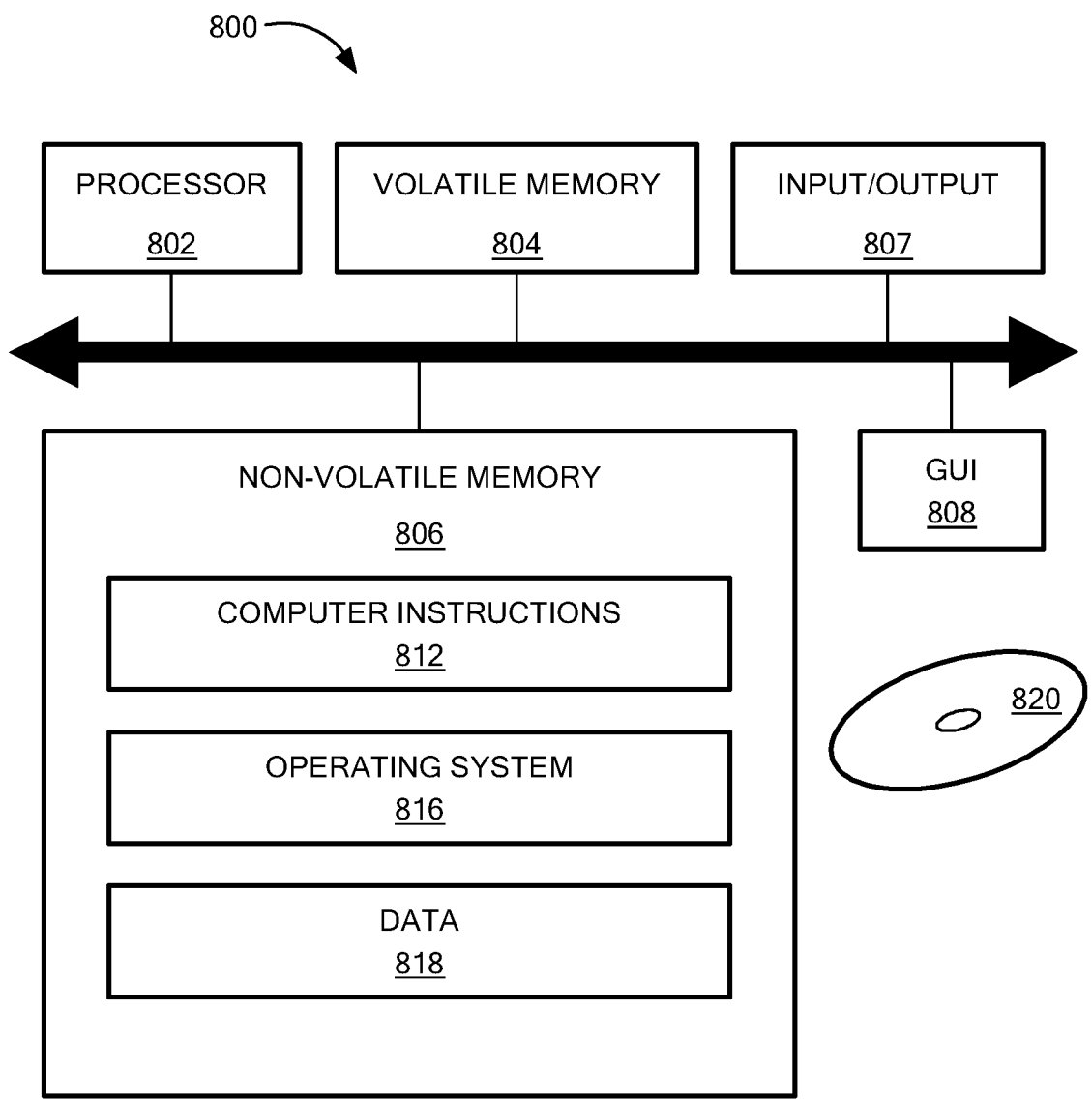
FIG. 8 is a schematic representation of an example computer that can perform at least a portion of the processing described herein.

FIG. 8 shows an exemplary computer 800 that can perform at least part of the processing described herein. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A current sensor, comprising:
   an elongate current conductor having an input and an output and a longitudinal axis; and
   first, second, third and fourth magnetic field sensing elements, wherein the first, second, third and fourth magnetic field sensing elements are coupled in a bridge configuration, wherein the first, second, third and fourth magnetic field sensing elements are positioned in a plane parallel to a surface of the current conductor such that the second and fourth magnetic field sensing elements comprise inner elements and the first and third magnetic field sensing elements comprise outer elements with respect to the longitudinal axis, wherein the first and third magnetic field sensing elements are opposite each other in the bridge and the second and fourth magnetic field sensing elements are opposite each other in the bridge, wherein the second and fourth magnetic field sensing elements at least partially overlap with the current conductor, wherein the first, second, third and fourth magnetic field sensing elements are positioned in relation to the current conductor.

2. The current sensor according to claim 1, wherein the first, second, third and fourth magnetic field sensing elements are aligned along an axis perpendicular to the longitudinal axis of the current conductor.

3. The current sensor according to claim 1, wherein the first, second, third and fourth magnetic field sensing elements are spaced equidistantly along the axis perpendicular to the longitudinal axis of the current conductor.

4. The current sensor according to claim 1, wherein the current conductor includes a narrowed region, wherein the second and fourth magnetic field sensing elements at least partially overlap narrowed portion of the current conductor.

5. The current sensor according to claim 1, wherein the first, second, third and fourth magnetic field sensing elements comprise magnetoresistive elements.

6. The current sensor according to claim 1, wherein the first, second, third and fourth magnetic field sensing elements comprise Hall elements.

7. The current sensor according to claim 1, wherein the first, second, third and fourth magnetic field sensing elements are sensitive in the vertical direction.

8. The current sensor according to claim 1, wherein the sensor is configured to subtract an interfering external field a signal of interest.

9. A method, comprising:
   employing an elongate current conductor having an input and an output and a longitudinal axis; and
   employing first, second, third and fourth magnetic field sensing elements, wherein the first, second, third and fourth magnetic field sensing elements are coupled in a bridge configuration, wherein the first, second, third and fourth magnetic field sensing elements are positioned in a plane parallel to a surface of the current conductor such that the second and fourth magnetic field sensing elements comprise inner elements and the first and third magnetic field sensing elements comprise outer elements with respect to the longitudinal axis, wherein the first and third magnetic field sensing elements are opposite each other in the bridge and the second and fourth magnetic field sensing elements are opposite each other in the bridge, wherein the second and fourth magnetic field sensing elements at least partially overlap with the current conductor, wherein the first, second, third and fourth magnetic field sensing elements are positioned in relation to the current conductor.

10. The method according to claim 9, wherein the first, second, third and fourth magnetic field sensing elements are aligned along an axis perpendicular to the longitudinal axis of the current conductor.

11. The method according to claim 9, wherein the first, second, third and fourth magnetic field sensing elements are spaced equidistantly along the axis perpendicular to the longitudinal axis of the current conductor.

12. The method according to claim 9, wherein the current conductor includes a narrowed region, wherein the second and fourth magnetic field sensing elements at least partially overlap narrowed portion of the current conductor.

13. The method according to claim 9, wherein the first, second, third and fourth magnetic field sensing elements comprise magnetoresistive elements.

14. The method according to claim 9, wherein the first, second, third and fourth magnetic field sensing elements comprise Hall elements.

15. The method according to claim 9, wherein the first, second, third and fourth magnetic field sensing elements are sensitive in the vertical direction.

16. The method according to claim 9, wherein the sensor is configured to subtract an interfering external field from a signal of interest.

17. A current sensor, comprising:
   an elongate current conductor having an input and an output and a longitudinal axis, wherein the elongate conductor includes first and second conductors coupled in parallel and separated by a non-conductive region between the first and second conductors; and
   first, second, third and fourth magnetic field sensing elements, wherein the first, second, third and fourth magnetic field sensing elements are coupled in a bridge configuration, wherein the first, second, third and fourth magnetic field sensing elements are positioned in a plane parallel to a surface of the current conductor such that the second and fourth magnetic field sensing elements comprise inner elements and the first and third magnetic field sensing elements comprise outer elements with respect to the longitudinal axis, wherein the first and third magnetic field sensing elements are opposite each other in the bridge and the second and fourth magnetic field sensing elements are opposite each other in the bridge, wherein the second magnetic field sensing element at least partially overlaps with the first conductor and the fourth magnetic field sensing element at least partially overlaps with the second conductor, wherein the first, second, third and fourth magnetic field sensing elements are positioned in relation to the current conductor.

18. The current sensor according to claim 17, wherein the first, second, third and fourth magnetic field sensing elements are aligned along an axis perpendicular to the longitudinal axis of the current conductor.

19. The current sensor according to claim 17, wherein the first, second, third and fourth magnetic field sensing elements are spaced equidistantly along the axis perpendicular to the longitudinal axis of the current conductor.

20. The current sensor according to claim 17, wherein the first and third magnetic field sensing elements at least partially overlap with the non-conductive region.

21. The current sensor according to claim 17, wherein the first, second, third and fourth magnetic field sensing elements comprise magnetoresistive elements.

22. The current sensor according to claim 17, wherein the first, second, third and fourth magnetic field sensing elements comprise Hall elements.

23. The current sensor according to claim 17, wherein the first, second, third and fourth magnetic field sensing elements are sensitive in the vertical direction.

24. The current sensor according to claim 17, wherein the sensor is configured to subtract an interfering external field from a signal of interest.

25. A method, comprising:
employing an elongate current conductor having an input and an output and a longitudinal axis, wherein the elongate conductor includes first and second conductors coupled in parallel and separated by a non-conductive region between the first and second conductors; and
employing first, second, third and fourth magnetic field sensing elements, wherein the first, second, third and fourth magnetic field sensing elements are coupled in a bridge configuration, wherein the first, second, third and fourth magnetic field sensing elements are positioned in a plane parallel to a surface of the current conductor such that the second and fourth magnetic field sensing elements comprise inner elements and the first and third magnetic field sensing elements comprise outer elements with respect to the longitudinal axis, wherein the first and third magnetic field sensing elements are opposite each other in the bridge and the second and fourth magnetic field sensing elements are opposite each other in the bridge, wherein the second magnetic field sensing element at least partially overlaps with the first conductor and the fourth magnetic field sensing element at least partially overlaps with the second conductor, wherein the first, second, third and fourth magnetic field sensing elements are positioned in relation to the current conductor.

26. The method according to claim 25, wherein the first, second, third and fourth magnetic field sensing elements are aligned along an axis perpendicular to the longitudinal axis of the current conductor.

27. The method according to claim 25, wherein the first, second, third and fourth magnetic field sensing elements are spaced equidistantly along the axis perpendicular to the longitudinal axis of the current conductor.

28. The method according to claim 25, wherein the first and third magnetic field sensing elements at least partially overlap with the non-conductive region.

29. The method according to claim 25, wherein the first, second, third and fourth magnetic field sensing elements comprise magnetoresistive elements.

30. The method according to claim 25, wherein the first, second, third and fourth magnetic field sensing elements comprise Hall elements.

31. The method according to claim 25, wherein the first, second, third and fourth magnetic field sensing elements are sensitive in the vertical direction.

32. The method according to claim 25, wherein the sensor is configured to subtract an interfering external field from a signal of interest.

33. A current sensor, comprising:
a means for conducting current; and
first, second, third and fourth means for sensing magnetic fields generated by the means for conducting current, wherein the third and fourth means for sensing magnetic fields are connected in a bridge; and
a means for subtracting an interfering external field similarly affecting the first, second, third and fourth means for sensing magnetic fields.

* * * * *

UNITED STATES PATENT AND TRADEMARK OFFICE
CERTIFICATE OF CORRECTION

PATENT NO. : 11,561,112 B2  
APPLICATION NO. : 16/818199  
DATED : January 24, 2023  
INVENTOR(S) : Robert A. Briano et al.

Page 1 of 1

It is certified that error appears in the above-identified patent and that said Letters Patent is hereby corrected as shown below:

In the Specification

Column 5, Line 38, delete "current conductor 116" and replace with --current conductor 104--.

Column 5, Line 42, delete "current conductor 204" and replace with --current conductor 104--.

Signed and Sealed this  
Fifth Day of December, 2023

Katherine Kelly Vidal  
*Director of the United States Patent and Trademark Office*